United States Patent [19]

Shoji

[11] Patent Number: 5,408,486
[45] Date of Patent: Apr. 18, 1995

[54] SURFACE EMITTING LASER PROVIDED WITH LIGHT MODULATOR

[75] Inventor: Hajime Shoji, Kawasaki, Japan
[73] Assignee: Fujitsu Limited, Kawasaki, Japan
[21] Appl. No.: 186,465
[22] Filed: Jan. 26, 1994

[30] Foreign Application Priority Data

Mar. 31, 1993 [JP] Japan .................. 5-074077

[51] Int. Cl.$^6$ ................................ H01S 3/19
[52] U.S. Cl. ...................... 372/45; 372/96; 372/26; 372/99; 372/107
[58] Field of Search ............. 372/45, 96, 26, 99, 372/107

[56] References Cited

U.S. PATENT DOCUMENTS 4,949,350 8/1990 Jewell et al. ................... 372/45
5,208,820 5/1993 Kurihara et al. ............... 372/45

FOREIGN PATENT DOCUMENTS 465145 8/1992 European Pat. Off. .
4-247676 9/1992 Japan .

OTHER PUBLICATIONS

Journal of Crystal Growth, vol. 120, No. 1/4, 11 May 1992, Amsterdam NL pp. 349–352 C. Stark et al 'Well-size dependence of electrooptic effects in GaInAsP/InP quantum wells grown by MBE'.
Patent Abstracts of Japan vol. 17, No. 19 (E-1306) 13 Jan. 1993 & JP-A-04 247 676 (NTT).
Patent Abstracts of Japan vol. 13, No. 330 (E-793) 25 Jul. 1989 & JP-A-01 094 689 (Furukawa Electric Ind Co Ltd.).
Applied Physics Letters, vol. 60, No. 6, 10 Feb. 1992, New York US pp. 686–688 M. Jupina et al 'InAs/GaAs short period strained layer superlattices grown on GaAs as quantum confined stark effect modulators'.
Patent Abstracts of Japan vol. 16, No. 123 (P-1330) 27 Mar. 1992 & JP-A-03 290 614 (NEC).

*Primary Examiner*—Georgia Y. Epps
*Attorney, Agent, or Firm*—Staas & Halsey

[57] ABSTRACT

The surface emitting laser of the present invention provided with a resonator has a structure in which a quantum well structure where a light absorption wavelength region is changed due to the Wannier-Stark effect or quantum-confinement Stark effect is formed in the non-doped Distributed Bragg Reflector mirror at the opposite side to a semiconductor substrate out of a pair of Distributed Bragg Reflector mirrors sandwiching the resonator.

13 Claims, 8 Drawing Sheets

SURFACE EMITTING LASER PROVIDED WITH LIGHT MODULATOR

BACKGROUND OF THE INVENTION

1. Field of the Invention

The present invention relates to a surface emitting laser provided with a light modulator.

2. Description of the Related Art

As an external modulator for changing the light intensity of a semiconductor laser, it is known which is made by forming an n-InP cladding layer 2, InGaAsP quantum well layer 3, and p-InP cladding layer 4 on an n-InP substrate 1 in order by means of epitaxial growth and forming a p-electrode 5 on the cladding layer 4 and an n-electrode 6 under the substrate 1 as shown in FIG. 1A. The external light modulator changes the absorption wavelength of the light passing through the quantum well layer 3 to perform light modulation by using the characteristic that the light absorption coefficient of the quantum well layer 3 is changed due to a change of the electric field in the quantum well layer 3.

Since this type of light modulator requires a long waveguide, the overall thickness of a device increases by mounting the light modulator on a surface emitting laser.

Therefore the absorption loss increases and the optical output decreases when the electric field of the light modulator is not generated.

A surface emitting laser free from the above problem is described in the official gazette of, for example, Japanese Patent Laid-Open (KOKAI) No. Hei 4-247676. For this apparatus, as shown in FIG. 1B, an n-InP buffer layer 8, saturable absorption layer 9 comprising an n-InGaAs/InP superlattice, n-InP cladding layer 10, active layer 11 comprising an InGaAs/InP superlattice, p-InP cladding layer 12, and p-InGaAs cap layer 13 are formed on an n-InP substrate 7 in order, high-reflectance films 14 and 15 are formed on the cap layer 13 and under the semiconductor substrate 7, a p-electrode 16 is formed around the high-reflectance film 14 on the cap layer 13, an n-electrode 17 is formed on the outer periphery of the saturable absorption layer 9, and moreover an electrode 18 for applying an electric field to the saturable absorption layer 9 is formed on the outer periphery of the buffer layer 8.

This apparatus changes the quantity of light to be absorbed in a resonator by the saturable absorption layer 9 to perform light modulation by using the characteristic that a light absorption wavelength is changed due to the quantum-confinement Stark effect when applying an electric field to the saturable absorption layer 9.

For the structure in which the light modulator is formed in the resonator, however, current also flows to the saturable absorption layer 9 when it flows from the p-electrode 16 to the n-electrode 17 and thus, carrier transition always occurs between a conduction band and a valence band of the saturable absorption layer 9. Therefore, it is difficult to control the absorption wavelength by applying the electric field to the saturable absorption layer 9.

SUMMARY OF THE INVENTION

It is an object of the present invention to provide a surface emitting laser for accurately controlling an absorption wavelength without being subject to the current flowing through a resonator.

The present invention provides a surface emitting laser having a quantum well structure in which a light absorption wavelength band is changed due to the presence and absence of an electric field, which is provided in a non-doped Distributed Bragg Reflector mirror at the opposite side to a semiconductor substrate. A change of the light absorption wavelength band is caused by the Wannier-Stark effect or quantum-confinement Stark effect.

Therefore, by applying a modulation signal for changing the electric field in the DBR mirror, the reflection loss of the DBR mirror is changed and the optical output is modulated.

In this case, the modulator is not subject to the current flowing through the resonator and securely controls the optical output because the quantum well structure is formed not in the resonator but in the DBR mirror outside the resonator.

Moreover, another invention of the present invention provides a surface emitting laser in which a multiple quantum well layer is formed where a light absorption wavelength band includes a laser oscillation wavelength when no electric field is applied to the non-doped DBR mirror at the opposite side to a substrate out of two non-doped DBR mirror formed at the both ends of a resonator but does not include the laser oscillation wavelength when an electric field is applied to it.

The change of a light absorption wavelength edge due to the presence and absence of an electric field is caused by the Wannier-Stark effect. That is, when an electric field is applied, the light absorption loss is small in a low refractive index layer of one DBR mirror, the reflectance of the DBR mirror increases, laser oscillation is obtained at a low threshold, and light is effectively output. When no electric field is applied, light absorption in the low refractive index layer extremely increases and the reflectance of a DBR mirror decreases. Therefore, the reflection loss of the resonator greatly increases and, at the same time, the light outputting efficiency is decreased due to the increase of light absorption and the optical output decreases.

Therefore, the light output of a surface emitting laser is modulated by intermittently applying an electric field.

Still another invention of the present invention provides a surface emitting laser in which a quantum well structure with an energy band gap larger than that of an active layer is provided in a low refractive index layer of the DBR mirror at the opposite side to a substrate out of a pair of non-doped DBR mirrors formed at the both ends of a resonator.

When no electric field is applied to one of the two DBR mirrors, the light absorption loss is small because the energy band gap of the quantum well in the DBR mirror is larger than that of an active layer. When an electric field is applied to one of the two DBR mirrors, the energy band gap of the quantum well in the DBR mirror gets small by quantum-confinement Stark effect and light absorption extremely increases. Moreover, because a refractive-index change occurs at the same time, the wavelength where the reflectivity of the DBR mirror is maximized changes.

Therefore, by applying a modulation signal for changing the electric field to one of the two DBR mirrors, the output of a surface emitting laser is modulated.

A quantum well structure in which a light absorption wavelength is changed by applying an electric field is provided in a non-doped DBR mirror formed at an end of a resonator. Therefore, it is possible to accurately control an absorption wavelength without being subject to the current flowing through the resonator.

DESCRIPTION OF THE PREFERRED EMBODIMENTS

First Embodiment

Figure 1A:
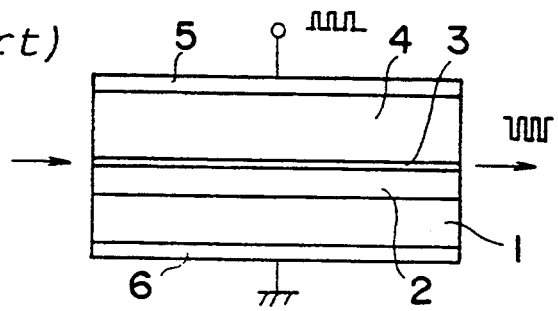
FIG. 1A is a sectional view of a first embodiment of a surface emitting laser according to the prior art and FIG. 1B is a sectional view of a second embodiment of the surface emitting laser according to the prior art.
Figure 1B:
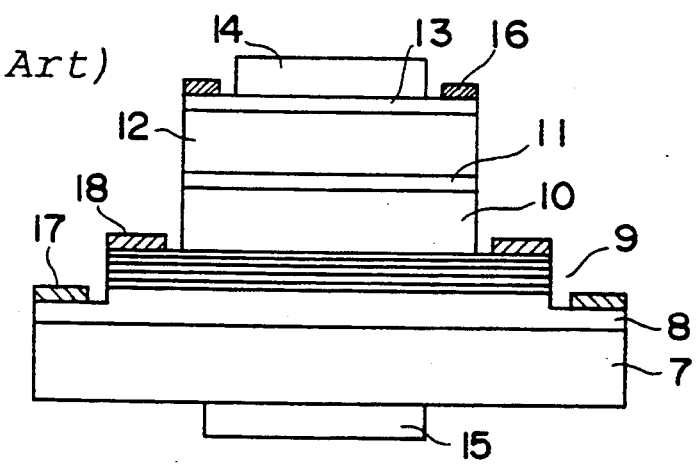
Figure 2A:
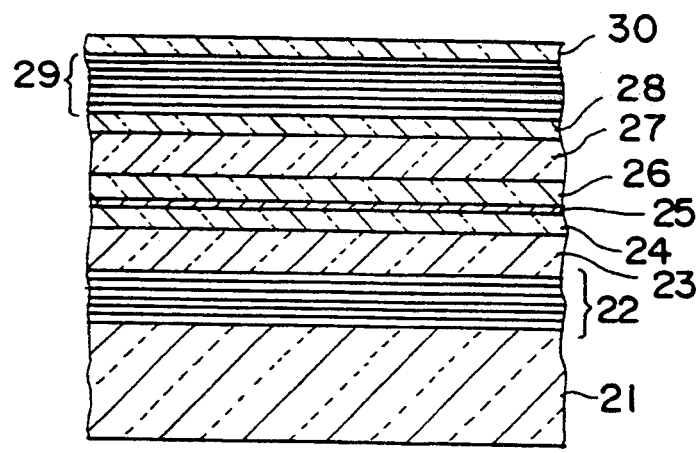
FIGS. 2A and 2B are sectional views of a surface emitting laser of a first embodiment of the present invention provided with a resonator and the steps of fabricating the surface emitting laser.
Figure 2B:
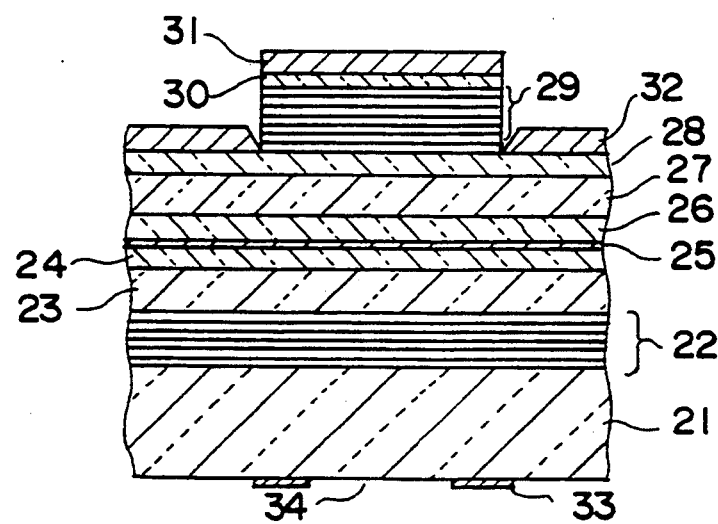
Figure 3:
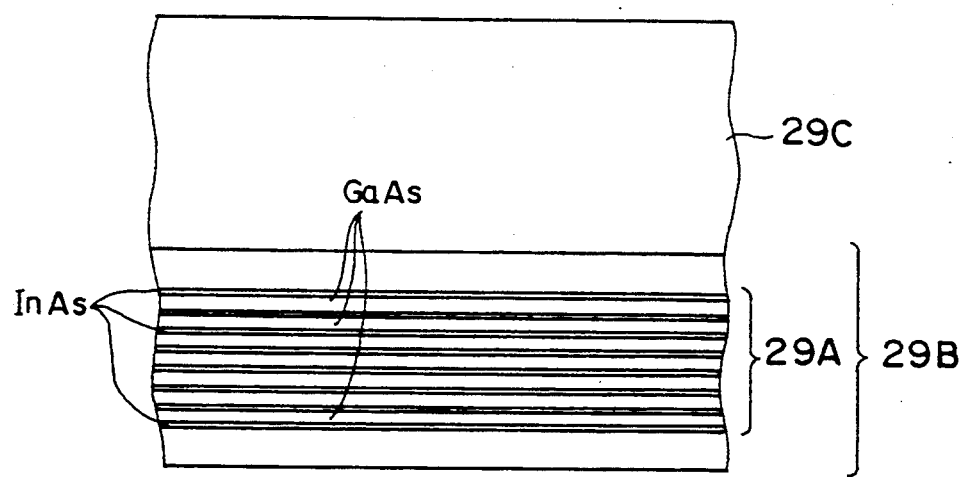
FIG. 3 is a sectional view of a part of the structure of a DBR mirror of the surface emitting laser of the first embodiment of the present invention.
Figure 4A:
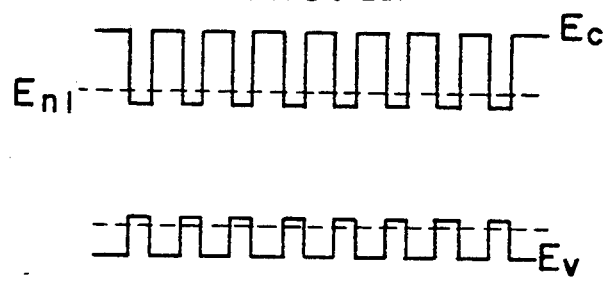
FIGS. 4A and 4B are energy band diagrams showing a change of a wave function due to the presence and absence of an electric field of the surface emitting laser of the first embodiment of the present invention and FIG. 4C is a diagram showing the relationship between light absorption coefficient and wavelength due to the presence and absence of the electric field.
Figure 4B:
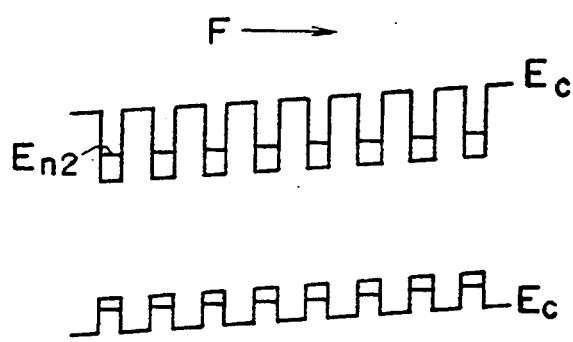
Figure 4C:
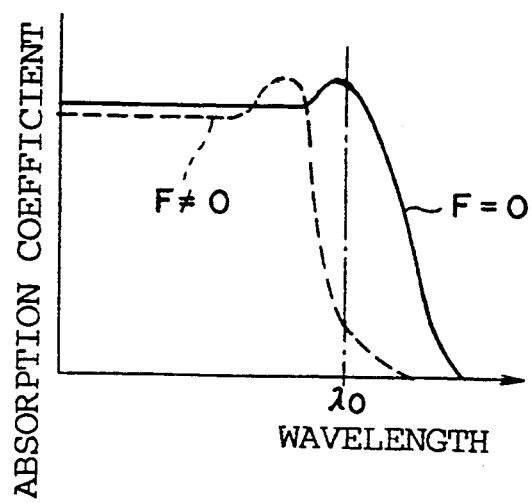

FIGS. 2A and 2B are sectional views of the steps of fabricating the surface emitting laser of the first embodiment of the present invention, FIG. 3 is a partially sectional view of a DBR mirror of the surface emitting laser, and FIGS. 4A to 4C are illustrations for explaining operations of the surface emitting laser. In this case, the surface emitting laser has a structure in which the oscillation wavelength $\lambda 0$ equals 0.98 $\mu m$.

As shown in FIG. 2A, a lower Distributed Bragg Reflector mirror (DBR) 22 comprising 28.5 pairs of an n-AlAs layer and an n-GaAs layer is formed by forming an n-AlAs layer up to the thickness of 83.1 nm and an n-GaAs layer up to the thickness of 69.6 nm in order by means of the metal-organic chemical vapor deposition on an n-GaAs substrate 21 with the Si concentration of $2 \times 10^{18}$ atoms/cm$^3$ and the thickness of 100 $\mu m$ and repeating the formation of the layers. In this case, the Si concentration of the n-AlAs layer and n-GaAs layer is $3 \times 10^{18}$ atoms/cm$^3$ respectively and the n-AlAs layer pairs with the n-GaAs layer.

Then, an n-Al$_{0.2}$Ga$_{0.8}$As cladding layer 23 with the Si concentration of $2 \times 10^{18}$ atoms/cm$^3$, a non-doped GaAs barrier layer 24, a non-doped In$_{0.2}$Ga$_{0.8}$As single quantum well active layer 25, a non-doped GaAs barrier layer 26, a p-Al$_{0.2}$Ga$_{0.8}$As cladding layer 27 with the Zn concentration of $3 \times 10^{18}$ atoms/cm$^3$, and a first p-GaAs contact layer 28 with the Zn concentration of $3 \times 10^{18}$ atoms/cm$^3$ are formed in order up to the thicknesses of 130, 10, 8, 10, 100, and 208.8 nm respectively.

Thereby, the total thickness from the n-Al$_{0.2}$Ga$_{0.8}$As cladding layer 23 to the top first p-GaAs contact layer 28 comes to a value integer (N) times as long as the half-wavelength $\lambda/2$ and the distance from the bottom of the n-Al$_{0.2}$Ga$_{0.8}$As cladding layer 23 to a center of the thickness of the single quantum well active layer 25 in the film thickness direction comes to a value integer (M) (M<N) times as long as the half-wavelength $\lambda/2$. Thereby, the amplitude of a light standing wave is maximized in the active layer 25 and the active layer 25 is located at a position with the maximum light intensity.

Then, as shown in FIG. 3, an AlAs layer 29C makes a pair with two GaAs layers 29B which sandwich a superlattice structure (also known as a multiple quantum well structure) 29A made by alternately and repeatedly depositing a 1-atom InAs layer and a 4-atom GaAs layer 20 times and the paired layers are repeatedly deposited up to 23 stages to constitute an upper DBR mirror 29.

For the one-pair laminate structure, the total thickness of the superlattice structure 29A and the GaAs layer under the structure 29A is set to 70 nm, the total thickness of the two GaAs layers 29B sandwiching the superlattice structure 29A is set to 48.6 nm, and the thickness of the AlAs layer 29C is set to 83.1 nm. In this case, the superlattice structure 29A and the GaAs layers 29B serve as a high refractive index layer and the AlAs layer 29C serves as a low refractive index layer.

The upper DBR mirror 29 is formed as a non-doped layer containing no impurity.

After the DBR mirror 29 is formed, a second p-GaAs contact layer 30 with the Zn concentration of $3 \times 10^{18}$ atoms/cm$^3$ is formed up to the thickness of 500 nm as shown in FIG. 2A. Then, the second p-GaAs contact layer 30 and the upper DBR mirror 29 are patterned by means of dry etching such as RIBE (Reactive Ion Beam Etching) using a chlorine-based gas by using a not-illustrated SiO$_2$ pattern as a mask. Thereby, the layers 29 and 30 are left on a resonator as shown in FIG. 2B.

Then, a three-layer metallic film formed by depositing Ti, Pt, and Au in order is deposited on the contact layer 30 on the upper DBR mirror 29 and on the p-GaAs contact layer 28 around the mirror 29 by means of sputtering. The metallic film on the DBR mirror 29 is used as a light modulation electrode 31 and the metallic film on the contact layer 28 is used as a p-electrode 32.

Moreover, a two layer n-electrode 33 formed by depositing AuGe and Au in order and having a light passing hole 34 at its center is formed at the bottom of the GaAs substrate 21 just under the patterned upper DBR mirror 29.

Thus, manufacturing of a surface emitting laser is completed.

In the above surface emitting laser, when current flows from the p-electrode 32 toward the n-electrode 33, a standing wave of the light produced by induced emission is generated in the resonator between the DBR mirrors 22 and 29 and its output light is emitted through the light passing hole 34 of the n-electrode 33.

Light modulation of the surface emitting laser is performed by applying a predetermined signal for electric field modulation to the light modulation electrode 31 and modulating the output light of the surface emitting laser. The theory of the modulation is described below.

In the semiconductor superlattice structure 29A of the upper DBR mirror 29, wave functions of electrons and holes between adjacent quantum wells are superimposed on each other and behave like in bulk as a whole when an electric field F is not applied. Therefore, a mini band En1 of energy close to a conduction band end Ec is formed as shown in FIG. 4A and electrons propagate in crystal. On the other hand, when the electric field F is applied, wave functions of electrons and holes between the quantum wells are not superimposed on each other because of an inclination of the potential due to the electric field F and behave like in a quantum well and a sub-band En2 with a high energy is generated in the quantum well in the case of the superlattice structure 29A as shown in FIG. 4B.

This effect is called the Wannier-Stark effect. As shown in FIG. 4C, a light absorption wavelength end of the superlattice 29A shifts to the short wavelength side when an electric field is applied (F≠0). As a result, the light absorption coefficient of the wavelength λ0 decreases due to application of the electric field.

According to the above theory, light with the oscillation wavelength of λ0 of the surface emitting laser is modulated by applying a modulation signal to the DBR mirror 29 at the opposite side to the semiconductor substrate 21.

Therefore, this embodiment has a structure for absorbing the light by making the light absorption wavelength edge longer than the oscillation wavelength λ0 of the laser when no electric field is applied to the superlattice structure 29A in the upper DBR mirror 29 shown in FIG. 2B and passing the light by making the light absorption wavelength edge shorter than the oscillation wavelength λ0 of the laser when an electric field is applied.

As described above, the reflectivity of the upper DBR mirror 29 increases, a low-threshold laser oscillation is obtained, and light is effectively emitted when an electric field is applied. When no electric field is applied, the light absorption coefficient of the DBR mirror 29 extremely increases. Therefore, the reflectivity of the DBR mirror 29 decreases, the reflection loss of the resonator greatly increases, and at the same time, the light outputting efficiency decreases due to increase of absorption and the optical output decreases.

Application of an electric field is performed by generating a potential difference between the p-electrode 32 and the light modulation electrode 31. Then, because the upper DBR mirror 29 is formed by a non-doped film, no current flows from the light modulation electrode 31 into the resonator when light is generated and therefore, the light can be modulated without affecting the resonator.

A voltage applied to the light modulation electrode 31 to generate an electric field can be higher or lower than a voltage applied to the p-electrode 32. To apply no electric field, it is necessary to make the voltage applied to the light modulation electrode 31 equal to the voltage applied to the p-electrode 32.

When assuming the oscillation wavelength of a surface emitting laser as λ0, the wavelength λ of the light passing through a semiconductor layer becomes equal to λ0/n (n: refractive index of semiconductor layer).

When assuming the thickness of a GaAs layer and AlAs layer in a DBR mirror as λ/4, the period comes to λ/2 and a standing wave with the wavelength of λ0 is formed by the DBR mirror. Therefore, the DBR mirrors 22 and 29 comprising the above structure have the wavelength selectivity of 980 nm and the oscillation wavelength of the surface emitting laser comes to 0.98 μm.

The AlAs and GaAs layers constituting the lower DBR mirror 22 are not formed as an integer number of pairs, but as 28.5 pairs in order to adjust a phase by using the n-AlAs layer as the top layer for increasing the refractive index of the top layer of the DBR mirror 22 and effectively confine electrons by raising an energy barrier outside the single quantum well active layer 25.

Second Embodiment

Figure 6A:
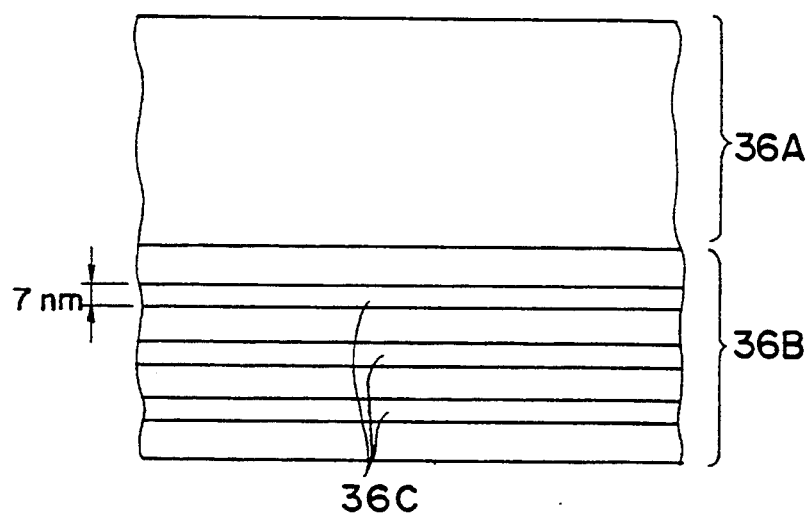
FIGS. 6A and 6B are sectional views of a part of the structure of a DBR mirror of the surface emitting laser of the second embodiment of the present invention.
Figure 6B:
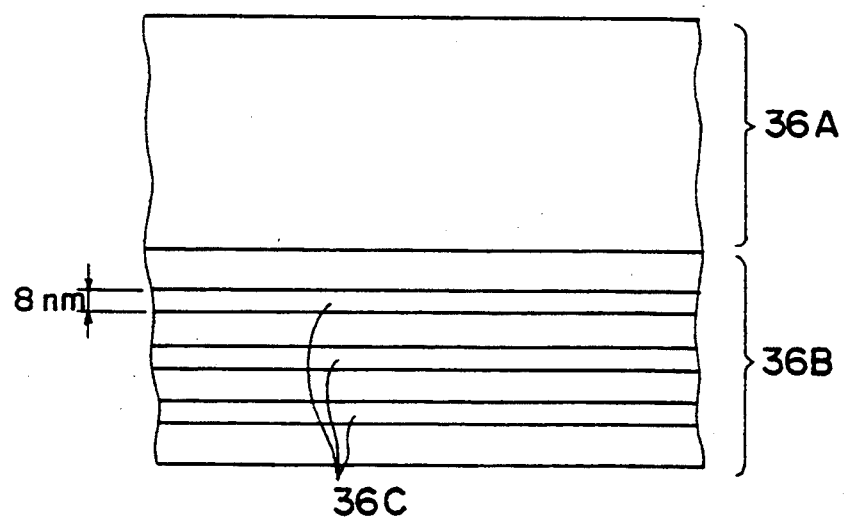
Figure 7A:
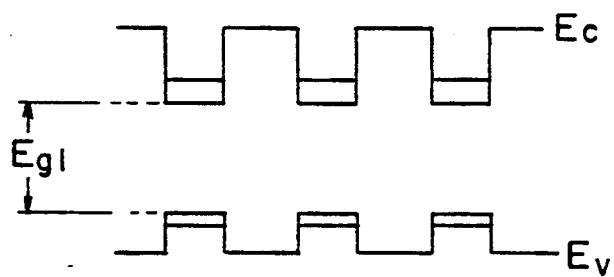
FIGS. 7A and 7B are energy band diagrams showing a change of an energy gap due to the presence and absence of the electric field of the surface emitting laser of the second embodiment of the present invention and FIG. 7C is a diagram showing the relationship between light absorption coefficient and wavelength due to the presence and absence of the electric field.
Figure 7B:
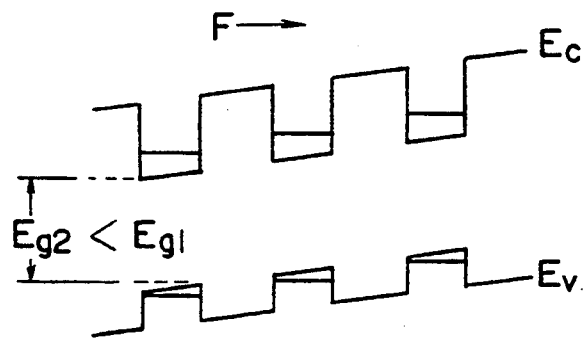
Figure 7C:
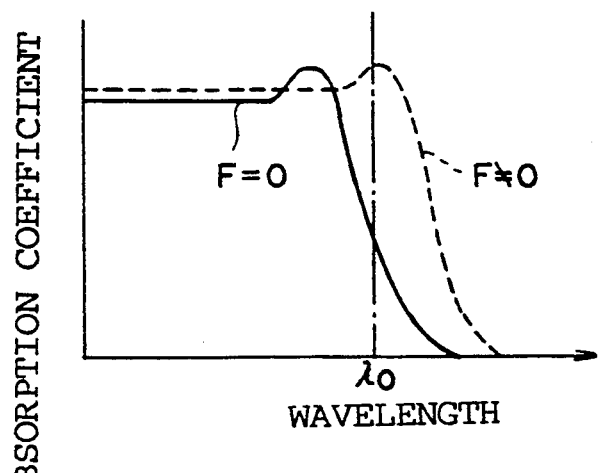

FIGS. 6A and 6B are sectional views of the surface emitting laser of the second embodiment of the present invention and FIGS. 7A to 7C are illustrations for explaining the operations of the surface emitting laser. In these figures, symbols same as those in FIGS. 2A and 2B represent the same elements.

The surface emitting laser of this embodiment is the same as that of the first embodiment up to the steps of forming the DBR mirror 22 comprising 28.5 pairs of n-GaAs and AlAs layers, n-AlGaAs cladding layer 23, GaAs barrier layer 24, $In_{0.20}Ga_{0.80}As$ single quantum well active layer 25, GaAs barrier layer 26, p-AlGaAs cladding layer 27, and first p-GaAs contact layer 28 on the n-GaAs substrate 21. The film thickness and the impurity concentration are also the same as those of the first embodiment.

Figure 5:
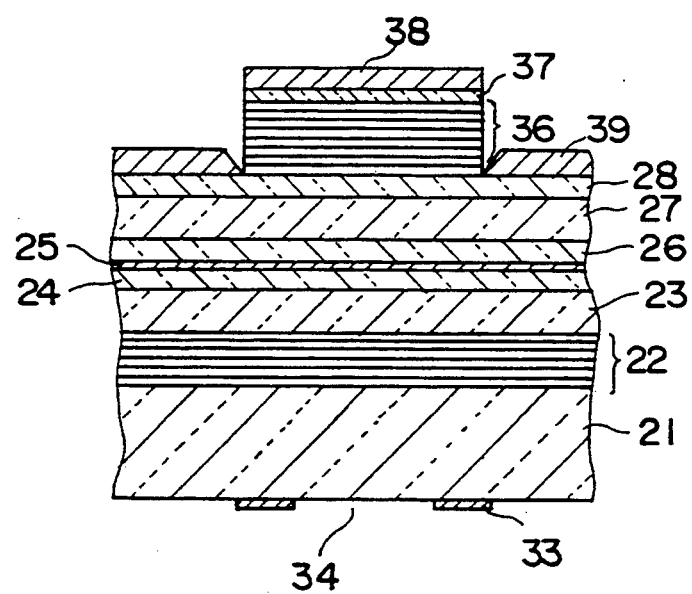
FIG. 5 is a sectional view of a surface emitting laser of a second embodiment of the present invention provided with a resonator.

An upper DBR mirror 36 is formed on the first p-GaAs contact layer 28 and the DBR mirror 36 is left only on the resonator region by using the lithography technique as shown in FIG. 5. The DBR mirror 36 is, as shown in FIG. 6A, constituted by pairing the non-doped AlAs layer 36A with a low refractive index and the non-doped GaAs layer 36B with a high refractive index and repeatedly depositing the paired layers up to 23 stages. In the GaAs layers 36B, only three $In_{0.20}Ga_{0.80}As$ quantum well layers 36C with the thickness of 7 nm are formed through the GaAs layers. The DBR mirror 36 is grown without containing impurities. The total thickness of the GaAs layers 36B including the quantum well layers 36C are 69.6 nm, the thickness of one quantum well layer 36C is 7 nm, and the thickness of the AlAs layers 36A is 83.1 nm. The thickness of a pair of GaAs and AlAs layers is set to 152.7 nm.

A second p-GaAs contact layer 37 with the Zn concentration of $3 \times 10^{18}$ atoms/cm$^3$ is formed on the DBR mirror 36 up to the thickness of 500 nm.

Moreover, a light modulation electrode 38 comprising Ti, Pt, and Au layers is formed on the second contact layer 37 and a p-electrode 39 is formed around the upper DBR mirror 36.

Furthermore, an n-electrode 33 comprising AuGe and Au layers and having a light passing hole 34 is formed at the bottom center of the GaAs substrate 21 just under the upper DBR mirror 36.

To drive the above surface emitting laser, current is flown from the p-electrode 39 to the n-electrode 33 to oscillate the surface emitting laser to emit light through the light passing hole 34 of the n-electrode 33, similarly to the case of the first embodiment. In this case, the oscillation wavelength comes to 0.98 μm similarly to the case of the first embodiment.

When no voltage is applied to the light modulation electrode 38, the energy band shown in FIG. 7A is obtained because the $In_{0.20}Ga_{0.8}As$ quantum well layer 36C in the upper DBR mirror 36 and the $In_{0.20}Ga_{0.8}As$ single quantum well active layer 25 are in the same three-dimensional system. In this case, because the film thickness of the single quantum well active layer 25 is thicker by 1 nm, the quantum well in the DBR mirror 36 has larger energy band gap between quantum levels (sub-bands) of a potential well than one in the DBR mirror 25. Thereby, the absorption loss in the DBR mirror 36 is smaller and light is effectively reflected there.

When a potential difference is generated between the light modulation electrode 38 and the p-electrode 39 and an electric field is applied to the DBR mirror 36, the energy band gap of the $In_{0.20}Ga_{0.80}As$ quantum well layer in the DBR mirror 36 is decreased from Eg1 to Eg2 due to the quantum-confinement Stark effect as shown in FIG. 7B and the light absorption at the wavelength $\lambda_0$ extremely increases as shown in FIG. 7C. Moreover, because the refractive index also changes, the wavelength in which the reflectivity of the DBR mirror 36 is maximized gets higher than the oscillation wavelength $\lambda_0$. Because of these two effects, the reflectivity of the DBR mirror 36 at the oscillation wavelength of a surface emitting laser decreases, the reflection loss of a resonator greatly increases, and the optical output from the surface emitting laser decreases when an electric field is applied (F≠0), while the reflectivity of the DBR mirror 36 increases and the optical output increases when no electric field is applied (F≠0).

By giving the above change of electric field with a modulation signal, it is possible to modulate the light output of the surface emitting laser.

Moreover, the DBR mirror 36 does not include any impurity. Therefore, even if a voltage is applied to the light modulation electrode 38, current hardly flows to the resonator under the electrode 38. Thus, light is easily modulated without affecting the resonator in case of oscillation.

To generate an electric field in the DBR mirror 36, it is necessary to make the voltage of the light modulation electrode 38 different from that of the p-electrode 39. It is possible to set the voltage of the electrode 38 to a value higher or lower than that of the p-electrode 39.

It is described above that the material of the quantum well layer 36C formed on the upper DBR mirror 36 is $In_{0.20}Ga_{0.8}P$ and the thickness of the layer is 7 nm. However, similar modulation is realized by setting the composition ratio X of $In_xGa_{1-x}As$ to, for example, 0.17 and forming the quantum well layer 36D with the thickness of 8 nm because the gap between the sub-bands of the quantum well gets larger than that of the single quantum well active layer 25 as shown in FIG. 6B.

Third Embodiment

Figure 8:
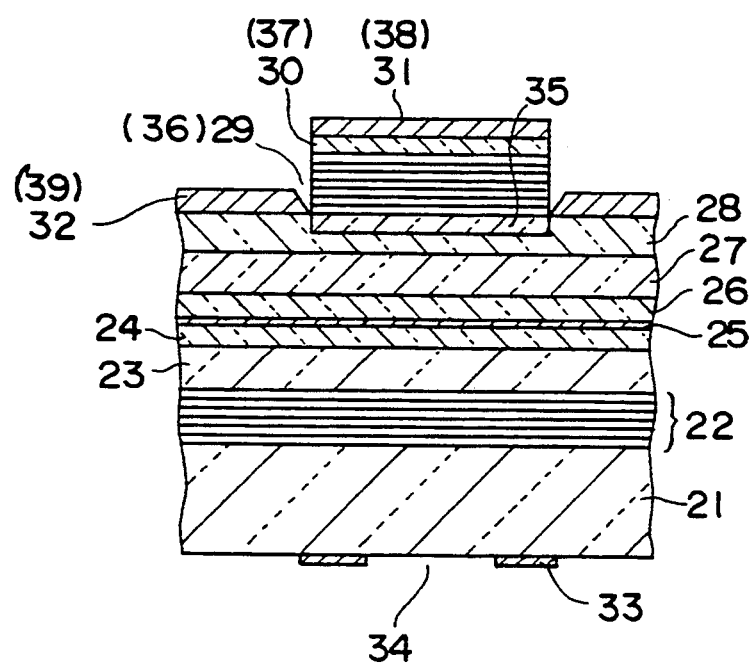
FIG. 8 is a sectional view of a surface emitting laser of a third embodiment of the present invention provided with a resonator.

FIG. 8 is a sectional view of the third embodiment of the present invention, in which the same symbols as those in FIGS. 2A and 2B represent the same elements.

The third embodiment is constituted by forming an n-GaAs contact layer 35 between the bottom of the upper DBR mirror 29 or 36 and the first p-GaAs contact layer 28 of the surface emitting laser of the first or second embodiment. Other structures of the third embodiment are the same as those of the first or second embodiment. For the above structure, the pn junction capacity at the bottom of the n-GaAs contact layer 35 gets larger than that of the lateral of the layer 35 because an electric field is applied from the light modulation electrode 31 to the p-electrode 32 (39) when applying the electric field to the DBR mirror 29 (36) by making the potential of the light modulation electrode 31 (38) positively higher than that of the p-electrode 32 (39). Therefore, the electric field applied to the DBR mirror 29 (36) becomes approximately vertically uniform to the face of the layer and modulation is easily performed.

Though the above active layer 25 is constituted with a single quantum well, it is possible to constitute the layer 25 with a multiple quantum well made by forming a pair of GaAs and InGaAs layers up to a plurality of stages.

The upper DBR mirrors 29 and 36 are not restricted to 28.5 pairs. It is possible to select the number of pairs most suitable for an optical output.

Moreover, it is also possible to form a current constriction layer in a cladding layer at the opposite side to a substrate as disclosed in U.S patent application Ser. No. 08/104,643, filed on Aug. 11, 1993, states issued..

The above embodiments use a material made of InGaAs and GaAsP. However, it is possible to use a material made of GaAs and AlGaAs or made of InGaAs and InGaAsP for the embodiments.

What is claimed is:

1. In a surface emitting laser provided with a modulator, comprising:
    a resonator having first and second barrier layers sandwiching a quantum well active layer and formed on a semiconductor substrate;
    a first Distributed Bragg Reflector mirror formed between the resonator and the semiconductor substrate;
    an undoped second Distributed Bragg Reflector mirror, formed at an end of the resonator at the opposite side to the semiconductor substrate and comprising a high refractive index layer and a low refractive index layer; and
    a quantum well layer formed in the second Distributed Bragg Reflector mirror, in which a light absorption wavelength band is changed due to presence and absence of an electric field.

2. A surface emitting laser provided with a modulator, comprising:
    a first Distributed Bragg Reflector mirror containing first-conducting-type impurities formed on a semiconductor substrate containing first-conducting-type impurities;
    a first cladding layer formed on the first distribution reflecting mirror and containing first-conducting-type impurities;
    an active layer having a quantum well structure, formed on the first cladding layer;
    a second cladding layer formed on the active layer and containing second-conducting-type impurities;
    a contact layer formed on the second cladding layer and containing second-conducting-type impurities;
    an undoped second Distributed Bragg Reflector mirror made of a semiconductor multilayer which has a mesa formation, formed on the contact layer and provided with a multiple quantum well structure in which the light absorption coefficient at a laser oscillation wavelength ($\lambda_0$) gets lower when an electric field is applied than when no electric field is applied;

a first electrode for applying a light modulation signal, formed on the second distribution reflecting mirror;

a second electrode formed on the contact layer around the second Distributed Bragg Reflector mirror; and a third electrode formed on the semiconductor substrate.

3. The surface emitting laser provided with a modulator according to claim 2, wherein the light absorption coefficient at the oscillation wavelength in the multiple quantum well structure is changed due to the Wannier-Stark effect.

4. The surface emitting laser provided with a modulator according to claim 2, wherein the second Distributed Bragg Reflector mirror has a high refractive index layer and a low refractive index layer and the multiple quantum well structure is formed in the high refractive index layer.

5. The surface emitting laser provided with a modulator according to claim 4, wherein the low refractive index layer is made of aluminum arsenide, the high refractive index layer is made of gallium arsenide, and the multiple quantum well structure comprises an indium-arsenide quantum well layer and a gallium-arsenide barrier layer.

6. The surface emitting laser provided with a modulator according to claim 2, wherein a first-conducting-type contact layer is formed between the bottom of the second Distributed Bragg Reflector mirror and the second-conducting-type contact layer.

7. The surface emitting laser provided with a modulator according to claim 2, wherein the quantum well structure of the active layer is one of a single quantum well structure and a multiple quantum well structure.

8. A surface emitting laser comprising:

a first Distributed Bragg Reflector mirror formed on a semiconductor substrate and containing first-conducting-type impurities;

a first cladding layer formed on the first Distributed Bragg Reflector mirror and containing first-conducting-type impurities;

an active layer with a quantum well structure, formed above the first cladding layer;

a second cladding layer formed on the active layer and containing second-conducting-type impurities;

a contact layer formed on the second cladding layer and containing second-conducting-type impurities;

an undoped second Distributed Bragg Reflector mirror which has a mesa formation formed on the contact layer and made of a semiconductor multilayer having a quantum well structure in which an energy band gap gets larger than that of the active layer when no electric field is applied and gets smaller than that of the active layer when an electric field is applied;

a first electrode for applying a light modulation signal, formed on the second Distributed Bragg Reflector mirror;

a second electrode formed on the contact layer around the second Distributed Bragg Reflector mirror; and a third electrode formed on the semiconductor substrate.

9. The surface emitting laser provided with a modulator according to claim 8, wherein the energy band gap in the quantum well structure is changed due to the quantum-confinement Stark effect.

10. The surface emitting laser provided with a modulator according to claim 8, wherein the second Distributed Bragg Reflector mirror has a high refractive index layer and a low refractive index layer and the quantum well structure is formed in the high refractive index layer.

11. The surface emitting laser provided with a modulator according to claim 4, wherein the low refractive index layer is made of aluminum arsenide, the high refractive index layer is made of gallium arsenide, and the multiple quantum well structure comprises an indium-gallium-arsenide quantum well layer and a gallium-arsenide barrier layer.

12. The surface emitting laser provided with a modulator according to claim 8, wherein a second contact layer containing first-conducting-type impurities is formed between the bottom of the second Distributed Bragg Reflector mirror and the contact layer.

13. The surface emitting laser provided with a modulator according to claim 8, wherein the quantum well structure of the active layer is one of a single quantum well structure and a multiple quantum well structure.

* * * * *

UNITED STATES PATENT AND TRADEMARK OFFICE
CERTIFICATE OF CORRECTION

PATENT NO. : 5,408,486
DATED : April 18, 1995
INVENTOR(S) : Shoji

It is certified that error appears in the above-indentified patent and that said Letters Patent is hereby corrected as shown below:

Col. 7, line 25, before "Because" insert new paragraph;
   line 32, after "applied" change "(F=/=0) to --F = 0--.

Signed and Sealed this

Twenty-second Day of August, 1995

Attest:

BRUCE LEHMAN

*Attesting Officer*    *Commissioner of Patents and Trademarks*